(12) United States Patent
Cooke (10) Patent No.: US 8,743,578 B2
(45) Date of Patent: Jun. 3, 2014

(54) USE OF HYDROCARBON NANORINGS FOR DATA STORAGE

(76) Inventor: Laurence H. Cooke, Los Gatos, CA (US)

( * ) Notice: Subject to any disclaimer, the term of this patent is extended or adjusted under 35 U.S.C. 154(b) by 123 days.

(21) Appl. No.: 13/559,842

(22) Filed: Jul. 27, 2012

(65) Prior Publication Data

US 2014/0029332 A1    Jan. 30, 2014

(51) Int. Cl.
G11C 19/08    (2006.01)
H01F 10/24    (2006.01)
H01L 51/00    (2006.01)
H01L 51/05    (2006.01)

(52) U.S. Cl.
CPC ............ H01F 10/24 (2013.01); H01L 51/0048 (2013.01); H01L 51/0508 (2013.01)
USPC .................. 365/33; 365/74; 365/66; 365/97; 365/48; 365/151

(58) Field of Classification Search
CPC ... H02N 11/006; A61B 5/04008; B82Y 30/00
USPC ............................ 365/151, 66, 97, 33, 48, 74
See application file for complete search history.

(56) References Cited

U.S. PATENT DOCUMENTS

| 7,354,877 | B2 | 4/2008 | Rosenberger et al. |
| 7,531,892 | B2 | 5/2009 | Pfefferle et al. |
| 7,687,160 | B2 | 3/2010 | Winarski |
| 2008/0020935 | A1* | 1/2008 | Volfson ......................... 505/180 |
| 2012/0117937 | A1 | 5/2012 | Cooke |

* cited by examiner

*Primary Examiner* — Thong Q Le
(74) *Attorney, Agent, or Firm* — Novak Druce Connolly Bove + Quigg LLP (57) ABSTRACT

Hydro-carbon nanorings may be used in storage. Sufficiently cooled, an externally hydrogen doped carbon nanoring may be used to create a radial dipole field to contain streams of electrons. Similarly, an internally hydrogen doped carbon nanoring may be used to create a radial dipole field to contain streams of positrons. When matched streams of positrons and electrons are sufficiently compressed they may form Cooper pairs with magnetic moments aligned to the movement of the stream. Matched adjacent Cooper pairs of electrons and positrons may contain information within their magnetic moments, and as such, may transmit and store information with little or no energy loss.

11 Claims, 7 Drawing Sheets

USE OF HYDROCARBON NANORINGS FOR DATA STORAGE

BACKGROUND OF THE INVENTION

Traditional electrical devices make use of moving electrical charges called current in an otherwise electrically neutral conductive medium, and the energy contained in each measure of those moving charges, called voltage, transports energy from its source to its destination or load. Usually this current is in the form of electrons, but it can be in the form of holes in semiconductors, or ions in uses such as welding or etching. This form of electrical energy, which is easily generated, is lossy due to resistance and electromagnetic radiation.

Recently researchers have found graphene and carbon nanotube structures have superconducting properties at reasonably high cryogenic temperatures. Nanotube structures composed of boron doped magnesium as described by Pfefferle et al. in U.S. Pat. No. 7,531,892, granted May 12, 2009, may superconduct up to temperatures of 100 degrees K. Furthermore, carbon nanotube structures are becoming more manufacturable, as described by Rosenberger et. al. in U.S. Pat. No. 7,354,877, granted Apr. 8, 2008.

While, the applications of high temperature superconducting structures are endless, embodiments within this disclosure will focus primarily information and energy storage, using hydrogen doped carbon nanorings, nanotubes connected to form a ring. Others, such as Winarski in U.S. Pat. No. 7,687,160, filed Apr. 6, 2006, have described the use of magnetic materials embedded within carbon nanotubes to contain information, but they do not employ the novel forms of electricity described within this specification. On the other hand, the inventor has disclosed these novel forms of electricity in U.S. patent application Ser. No. 12/946,052, filed on Nov. 15, 2010, published on May 17, 2012 as US Patent Application Publication Number 2012/0117937, which, for brevity of this application, is incorporated by reference herein in its entirety.

SUMMARY OF EMBODIMENTS OF THE INVENTION

In some embodiments of the invention, hydrocarbon nanorings may be used in storage of information. Sufficiently cooled, an externally hydrogen-doped carbon nanoring may be used to create a radial dipole field to contain streams of electrons. Similarly, an internally hydrogen-doped carbon nanoring may be used to create a radial dipole field to contain streams of positrons. When matched streams of positrons and electrons are sufficiently compressed they may form Cooper pairs with their magnetic moments aligned to the movement of the stream. Matched adjacent Cooper pairs of electrons and positrons may contain information within their magnetic moments, and as such, may transmit and store information with little or no energy loss.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF VARIOUS EMBODIMENTS

As was described by the inventor in U.S. patent application Ser. No. 12/946,052, filed on Nov. 15, 2010, a nanoring is a nanotube that is connected at its ends to form a tubular ring. One type of nanotube has a single layer of hexagonally connected carbon atoms, as if a portion of a sheet of hexagonally connected carbon atoms were rolled into a tube. A hydrogen carbon nanoring is a nanoring where extra bonds of carbon atoms 11 may be connected to hydrogen atoms 10, which may be either physically inside or outside the nanoring, as can be seen, respectively, in Figures 1a and 1b. These may form negative and positive radial dipoles within the respective nanorings, which may allow them to contain, respectively, streams of electrons and positrons.

Figure 1A:
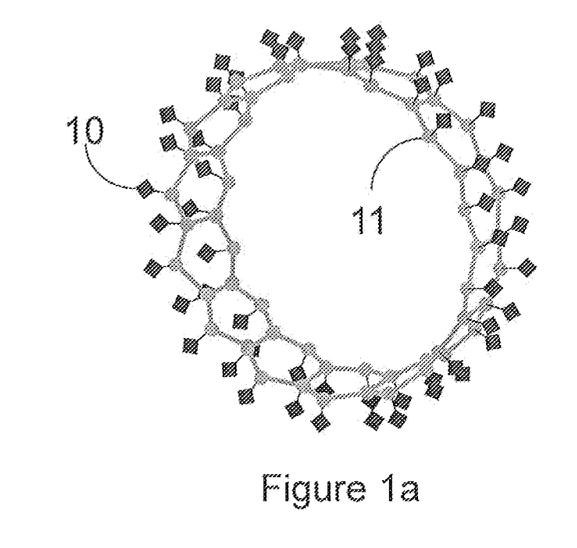
FIG. 1a is a diagram of a slice of an example of an exterior-doped nanoring.
Figure 1B:
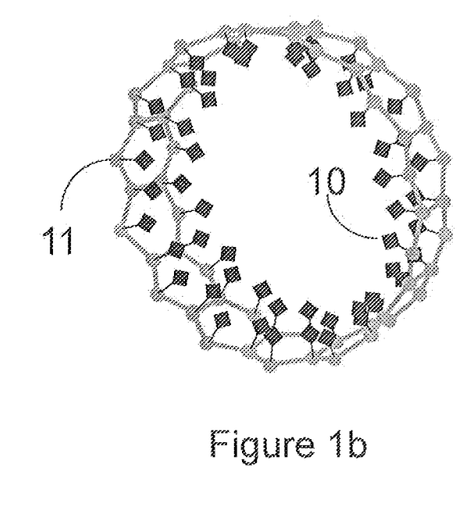
FIG. 1b is a diagram of a slice of an example of an interior-doped nanoring.

If a sufficient number of electrons and positrons are inserted into the centers of such nanorings, they may form a string of unbound charges under continuous repulsive tension between each other and the walls of the nanorings. The electrons and positrons may be held in the cross-sectional center of the rings by the dipole fields, and by the charges in front and in back of it down the tubular centers of the rings. A current may be generated by inductive coupling to each individual ring, which may have low or no resistance, even at relatively high temperatures compared to traditional superconductors.

Also note that streams of electrons or positrons, which after being forced tightly together, may collapse into Cooper pairs, pairs of electrons or positrons that rotate about each other. If they continue to be forced together, the Cooper pairs may all align with their axes of rotation coincident with the centers of the nanorings, so that in an embodiment of the invention, information may be stored in individual or coupled pairs of electron and/or positron nanorings by orienting and aligning the axes of rotation of successive moving positron and/or electron Cooper pairs. Furthermore, the information may be retrieved from the nanorings by measuring the magnetic variations from the positron and/or electron Cooper pairs as they move past one or more measurement mechanisms on the rings, where the frequency of such magnetic variations may be a function of the velocity of the current and the width of the magnetic alignments.

Further embodiments of the invention are now described with reference to FIGS. 2-8, it being appreciated that the figures illustrate the subject matter and may not be to scale or to measure.

Figure 2:
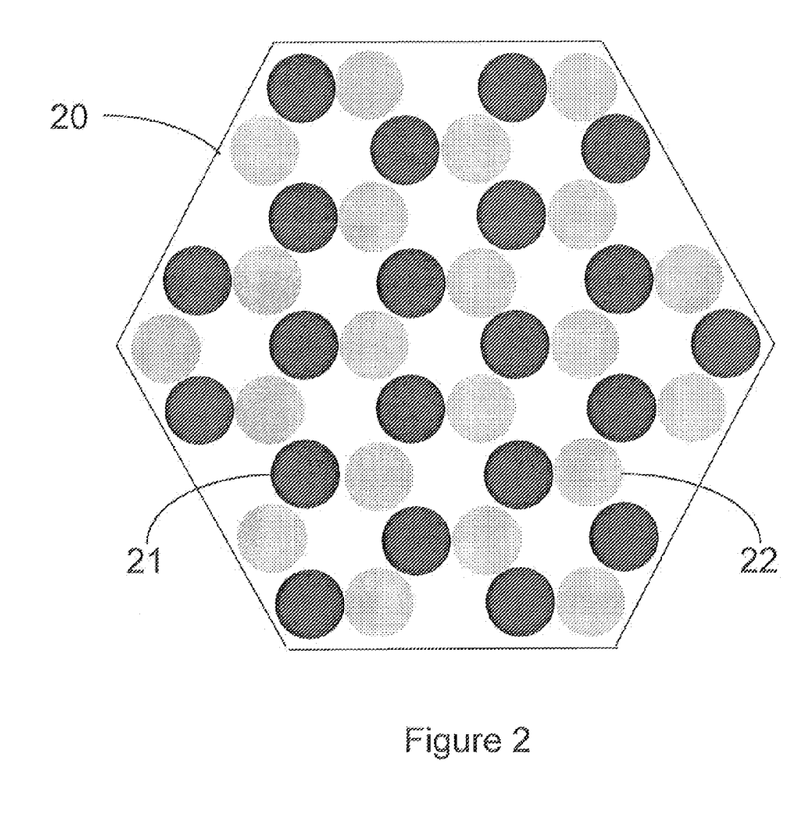
FIG. 2 is a diagram of an example placement of multiple nanorings, according to an embodiment of the invention.

Reference is now made to FIG. 2, a diagram of an example of placement of multiple nanorings of both types combined together. These may, in such an arrangement, form a larger lossless electrical transmission cable. In this case, the hexagonal cable 20 may be composed of an equal number of nanorings 21 containing electrons and nanorings 22 containing positrons, which may be arranged in an interleaved hexagonal structure to balance the attractive forces between the electron and positron nanorings.

Figure 3:
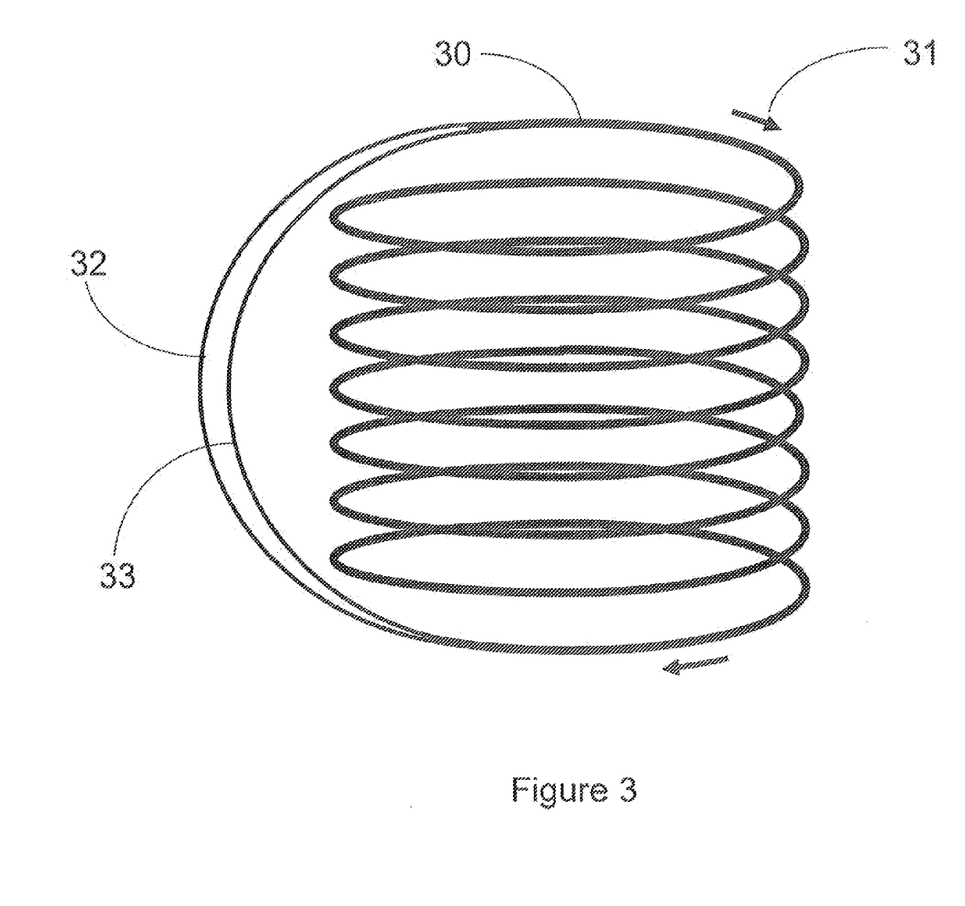
FIG. 3 is a simplified diagram of a structure for holding streams of electrons and positrons, according to an embodiment of the invention.

Reference is now made to FIG. 3, a diagram of an example of a structure for holding streams of electrons and positrons. The cable 30 may be organized into a ring and may be comprised of the hexagonal structure shown in FIG. 2, which may contain pairs of nanorings. The nanorings may contain equal streams of electrons and positrons flowing at equal rates in the direction indicated by the arrows 31. This arrangement may reduce or eliminate energy lost due to current fluctuations and may thereby enable maintaining the current flow almost indefinitely. Furthermore, some portion of the cable may be split into two bundles of nanorings, one containing streams of electrons 32, and the other containing streams of positrons 33.

Figure 4:
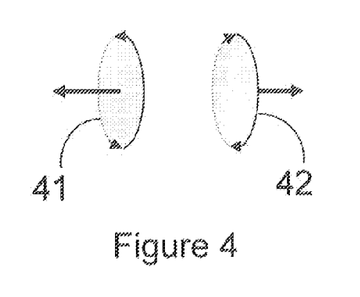
FIG. 4 is a diagram of two aligned Cooper pairs with opposite moments of magnetic inertia.

Reference is now made to FIG. 4, which shows a diagram of two aligned Cooper pairs with opposite moments of magnetic inertia. As was previously mentioned, when streams of electrons or positrons are compressed into appropriately doped nanorings, the streams of single charges may collapse into Cooper pairs. Continued compression of the Cooper pairs may align them such that their axes of rotation may be aligned with the center of the nanoring in which the respective Cooper pair is contained. As can be seen in the diagram, the magnetic moment orientations of the Cooper pairs 41 and 42 may be aligned but opposite because their rotations may be opposite each other. Without external magnetic fields, as the Cooper pairs compress, their magnetic moments may randomly alternate, which may result in canceling internal magnetic moments.

Figure 5:
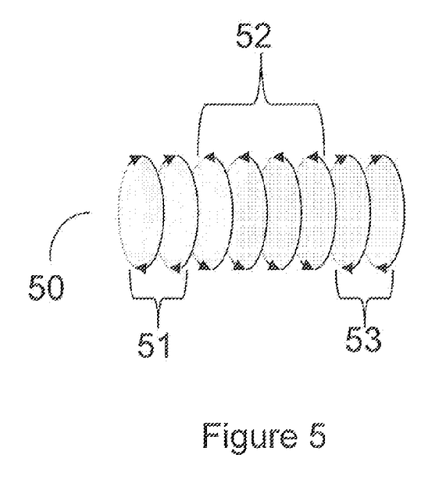
FIG. 5 is a diagram of multiple Cooper pairs compressed together.

Reference is now made to FIG. 5, a diagram showing an example of multiple Cooper pairs compressed together. In this example, the compressed set of Cooper pairs 50 contains two pairs 51 with one orientation, followed by four pairs 52 with the opposite orientation, followed by two more pairs 53 with the same orientation as pairs 51, such that, in the directions of their magnetic moments, the magnetic moments may cancel.

Figure 6:
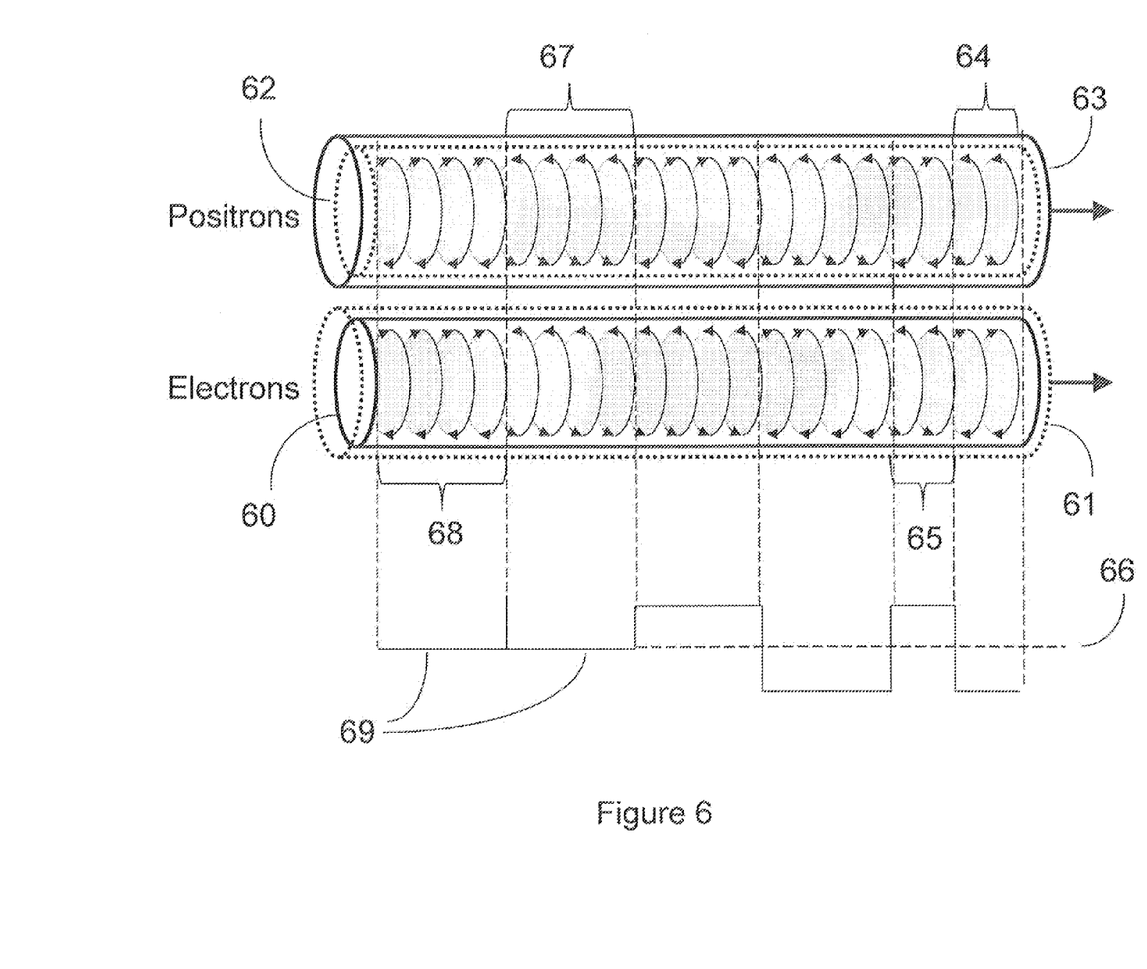
FIG. 6 is a diagram of multiple compressed Cooper pairs, organized and aligned to retain information within the a coupled pair of positron and electron nanorings.

Reference is now made to FIG. 6, a diagram showing multiple compressed Cooper pairs, organized and aligned to retain information within a coupled pair of positron and electron nanorings, according to an embodiment of the invention. The carbon nanoring 60 with externally-doped hydrogen 61 may contain a stream of compressed electron Cooper pairs. Similarly the carbon nanoring 63 with internally-doped hydrogen 62 may contain a stream of compressed positron Cooper pairs. Both are depicted in the diagram as moving from the left to the right, but the invention is not thus limited. The magnetic moments of the first two pairs of positrons and electrons 64 may be aligned in the same direction because the pairs with opposite charges may be rotating in opposite directions. The next two pairs 65 may also be aligned, but in the opposite direction. In a corresponding graph 66, the orientations of the pairs may be represented as measurable fluctuations of greater or lesser duration, depending on the velocities of the currents and the orientations of the Cooper pairs. When aligned positron and electron Cooper pairs both rotate in one direction 67 or in the opposite direction 68, their magnetic moments may cancel, leaving little or no measurable magnetic field 69.

While information may be stored within a single positron or electron stream, it may be very lossy and the stream may display a large electric charge. Matched pairs of positron and electron carbon nanorings may, in contrast, appear electrically neutral, and their respective streams of charged particles, being attracted to each other, may align, which may serve to reduce or eliminate external electric and magnetic fluctuations. In particular, the transmission of compressed positron and electron Cooper pairs may incur some small electromagnetic losses due to the magnetic fluctuations created by matching orientation of the Cooper pairs, as can be seen by the fluctuations in the graph 66. On the other hand, if the magnetic moments of the aligned positron and electron Cooper pairs cancel, there may be no perceived external magnetic fluctuations 69. In that case, the information contained within pairs of positron and electron Cooper pairs may circulate within a holding ring almost indefinitely without loss of information.

Figure 7:
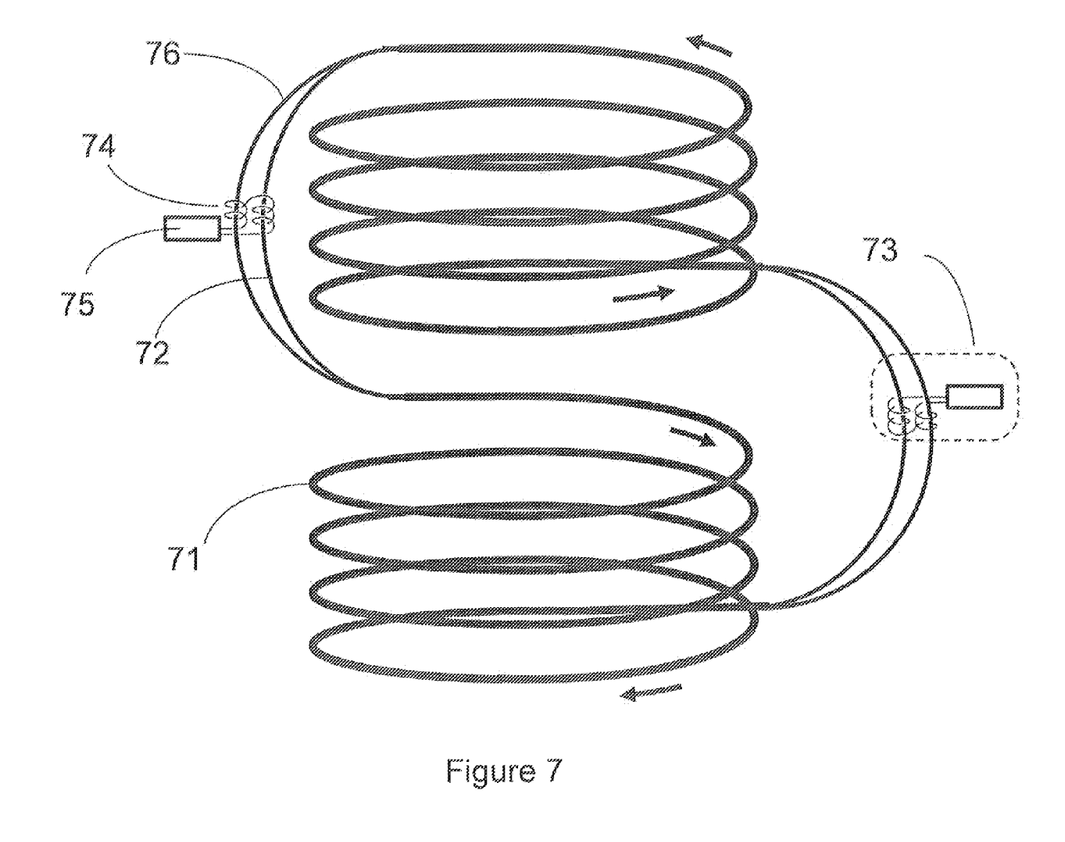
FIG. 7 is a diagram of an information storage system.

Reference is now made to FIG. 7, which is a diagram of an information storage system according to an embodiment of the invention. The system may include a structure 71 for holding at least one positron nanoring and at least one electron nanoring, where each nanoring may contain a moving stream of compressed Cooper pairs. To minimize space, the ring may be wound into a large cylinder or some other shape with a radius of curvature appropriate for the maximum velocity of the current and size of the nanorings with an organization of the nanorings, such as shown in FIG. 2, that may cancel external fields created by the current. As was previously shown, the positron and electron Cooper pairs may be aligned and may have magnetic moments that may cancel throughout the rings. While the pairs of nanorings are coupled, there may be little or no loss of energy or information. As was shown in FIG. 6, the information may be stored as a series of pulses that may have equal amounts of both magnetic moments in respective pulses. There may be one or more access locations 73 to read and/or write data out of and/or into the nanorings. To read information at these locations, a group of at least one positron nanoring 72 and a group of at least one electron nanoring 76, which may be bundled together after being decoupled from the structure 71, and oppositely coupled to a detector 74, such that the opposite magnetic moments may constructively align to produce a pulse that may be amplified by the control logic 75. Similarly, to write, alternating current pulses may be applied to the detector 74 by the control logic 75 with sufficient strength to flip both electron and positron Cooper pair magnetic moments.

Figure 8:
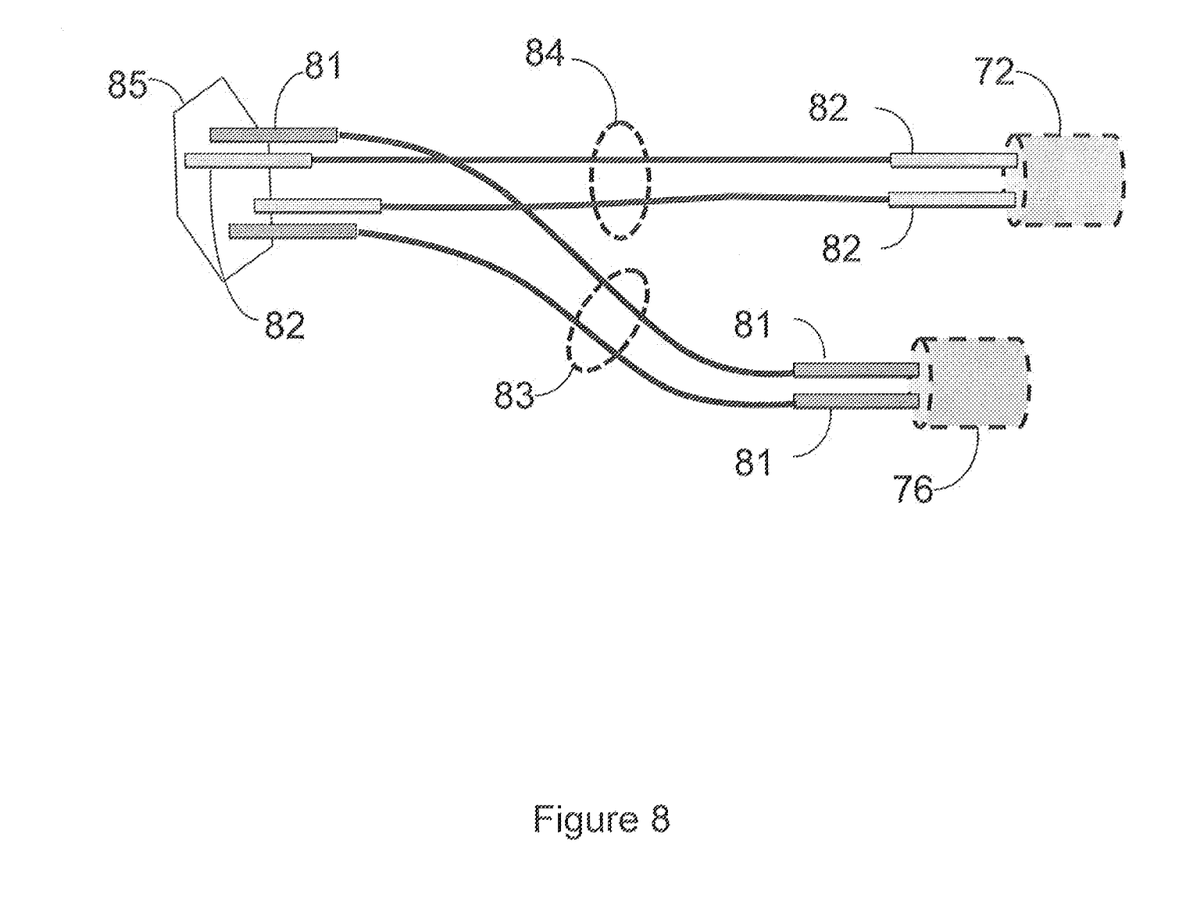
FIG. 8 is a diagram of the separation of electron and positron carbon nanorings out of a hexagonal holding structure.

Reference is now made to FIG. 8, a diagram showing an example of the separation of electron and positron carbon nanorings out of a hexagonal holding structure, according to an embodiment of the invention. The hexagonal holding structure 85 may contain equal numbers of positron and electron nanorings, which may be organized in a manner shown in FIG. 2. To create the bundle of positron nanorings 72 and the bundle of electron nanorings 76, one may organize the positron nanorings 82 and electron nanorings 81 from the hexagonal holding structure 85 into groups 83 and 84 to form into their respective bundles 76 and 72 such that all nanorings maintain the same length.

It is further understood that many electron and positron nanorings may be coupled together, but they may need to be decoupled and separated to perform the reads and writes. It is also understood that the detector may also be composed of one or more electron or electron and positron nanorings coiled one or more times about each bundle in such a manner that the signals acquired from storage nanorings may be suitably amplified to be subsequently detected by the control logic. It is also understood that the data may be sufficiently perturbed during reading that a write may need to follow each read in order to preserve the data. As such, it is also understood that there may be separate detectors designed exclusively for reading or writing and that any given access location may, in some cases, only perform either reading or writing, but not both. It is further understood that the density of data stored in the cable may be a function of the size of the detector and the alignment of the nanorings and that the amount of data stored may be a function of the length of the cable and the density of the stored data. Nevertheless, it is theoretically possible to maintain a bit of information in the infinitesimal space necessary to contain four electrons and four positrons, and such information may be maintained for an indefinite amount of time without any use of energy except when accessing or generating the data.

In addition, the latency of access of the data may be a function of the velocity of the streams of electrons and positrons, and the number of read and/or write locations on the cable. As such, it is further contemplated that the velocity of the streams of electrons and positrons may be varied as necessary for optimal storage and read/write access. It is further contemplated that such coiled cables may be combined with transmission cables such that the storage and transmission of information may be performed within one large ring of cable.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

I claim:

1. An apparatus for storage of information, comprising:
   at least one nanoring containing circulating electrons; and at least one nanoring containing circulating positrons;
   wherein the information is encoded in magnetic moments of at least one pair of positron and electron Cooper pairs.

2. The apparatus as in claim 1, wherein the encoding is performed by orienting the magnetic moments of corresponding electron and positron Cooper pairs.

3. The apparatus as in claim 2, wherein the magnetic moments cancel.

4. The apparatus as in claim 1, wherein the apparatus comprises at least one hexagonal cable formed by equal numbers of nanorings containing electrons and nanorings containing positrons.

5. The apparatus as in claim 4, wherein access locations of the the cable are organized into one bundle of nanorings containing electrons and one bundle of nanorings containing positrons.

6. The apparatus as in claim 5, further comprising one or more detectors coupled to respective control logic, coupled to the bundles, and configured to perform at least one of reading or writing of the information.

7. The apparatus as in claim 1, wherein the nanorings comprise hydrocarbon nanorings.

8. A method of information storage in a pair of bundles of one or more nanorings, wherein one of the bundles contains circulating electrons and the other one of the bundles contains circulating positrons, the method comprising:
   encoding information in magnetic moments of at least one pair of positron and electron Cooper pairs of the respective bundles.

9. The method as in claim 8, wherein the nanorings comprise hydrocarbon nanorings.

10. The method as in claim 8, wherein the encoding comprises orienting the magnetic moments of corresponding electron and positron Cooper pairs.

11. The method as in claim 10, wherein the magnetic moments cancel.

* * * * *